United States Patent
Fujii

(10) Patent No.: US 6,820,795 B2
(45) Date of Patent: Nov. 23, 2004

(54) JOINED ARTICLE OF A SUPPORTING MEMBER FOR A SEMICONDUCTOR WAFER AND A METHOD OF PRODUCING THE SAME

(75) Inventor: Tomoyuki Fujii, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 19 days.

(21) Appl. No.: 10/233,463

(22) Filed: Sep. 3, 2002

(65) Prior Publication Data

US 2003/0047589 A1 Mar. 13, 2003

(30) Foreign Application Priority Data

Sep. 5, 2001 (JP) ..................... P2001-268899

(51) Int. Cl.$^7$ ............. B23K 31/02; B23K 20/00; B23K 28/00
(52) U.S. Cl. ............ 228/121; 228/122.1; 228/195; 228/198
(58) Field of Search ............ 228/121, 122.1, 228/123.1, 193–195, 198, 199, 262.1, 218; 156/308.6, 310, 311; 53/432, 510, 512

(56) References Cited

U.S. PATENT DOCUMENTS

| | | | | |
|---|---|---|---|---|
| 4,624,404 A | * | 11/1986 | Ohmae et al. | 228/198 |
| 5,280,156 A | * | 1/1994 | Niori et al. | 219/385 |
| 5,372,298 A | * | 12/1994 | Glaeser | 228/195 |
| 5,794,838 A | * | 8/1998 | Ushikoshi et al. | 228/121 |
| 5,986,875 A | * | 11/1999 | Donde et al. | 361/234 |
| 6,106,960 A | * | 8/2000 | Fujii et al. | 428/627 |
| 6,221,197 B1 | * | 4/2001 | Mori et al. | 156/308.6 |
| 6,280,584 B1 | * | 8/2001 | Kumar et al. | 204/298.15 |
| 2002/0139473 A1 | * | 10/2002 | Fujii et al. | 156/330.9 |
| 2002/0139563 A1 | * | 10/2002 | Fujii et al. | 174/117 A |

FOREIGN PATENT DOCUMENTS

| | | | |
|---|---|---|---|
| EP | 0182128 A2 | * | 5/1986 |
| JP | 59-124140 | | 7/1984 |
| JP | 3-003249 | | 1/1991 |
| JP | 09-045757 A | * | 2/1997 |

* cited by examiner

Primary Examiner—L. Edmondson
(74) Attorney, Agent, or Firm—Burr & Brown

(57) ABSTRACT

A method for producing a joined body comprising a supporting member made of a ceramic material for supporting a semiconductor wafer, a metal member and a joining layer for joining the supporting and metal members is provided. A first metal film is formed on a joining surface of the supporting member. A second metal film is formed on a joining surface of the metal member. A metal adhesive is placed between the first and second films to provide an assembly. The assembly is then heated at a temperature not higher than a melting point of the metal adhesive while the assembly is subjected to isostatic pressing, so that the supporting and metal members are joined by diffusion joining.

16 Claims, 4 Drawing Sheets

(a)

(b)

JOINED ARTICLE OF A SUPPORTING MEMBER FOR A SEMICONDUCTOR WAFER AND A METHOD OF PRODUCING THE SAME

This application claims the benefit of Japanese Patent Application P2001-268899, filed on Sep. 5, 2001, the entirety of which is incorporated herein by reference.

BACKGROUND OF THE INVENTION

1. Field of the Invention

The invention relates to a method of producing a joined article of a semiconductor wafer supporting member, and a joined article of a semiconductor wafer supporting member.

2. Related Art Statement

In a semiconductor processing such as CVD, sputtering and etching, a semiconductor wafer is mounted on a susceptor, which is then heated to carry out the heat treatment of the wafer. Japanese patent laid-open publication 124, 140A/1984 disclosed the following process. An electrostatic chuck made of a ceramic material is used as a susceptor for adsorbing a semiconductor wafer and is heated to subject the wafer to a heat treatment. Alternatively, a ceramic heater is used as susceptor for mounting a semiconductor wafer thereon and involves directly heating the wafer. It is, however, necessary to reduce the temperature change during the adsorption-desorption cycles of semiconductor wafers on a susceptor to further improve the production of the semiconductor wafers. It is therefore needed to control and switch the heating and cooling of the wafer with a reduced time delay. The necessity of controlling the heating-cooling cycle demands a cooling system connected with the susceptor.

A technique of joining an electrostatic chuck onto a metal cooling board of the water cooling type by means of metal bonding was proposed by (Japanese Patent laid-open (Kokai) Publication A3249/1991). According to this technique, an electrostatic chuck with an alumina substrate and a water cooling board made of aluminum are joined by metal bonding using indium metal.

When indium is used as an adhesive for joining a ceramic electrostatic chuck and a water cooling flange made of a metal, however, an insufficient pressure during the joining process may induce bonding defects in the joining layer. The defects may reduce the reliability of the air-tightness of the joining layer. If the air-tightness along the joining interface of the electrostatic chuck and cooling flange would be insufficient, there would be a risk that a corrosive gas in a chamber might be leaked along the joining interface from the chamber. Moreover, when a back side gas is supplied between the back face of the semiconductor wafer and the chuck, there would be a risk that the gas might be leaked along the joining interface of the chuck and cooling flange. It is therefore demanded to secure the air-tightness along the joining interface between the chuck and flange with an excellent reliability.

Further, the flatness of the adsorption face for the wafer of the chuck may be deteriorated after the joining process, due to the difference of the thermal expansion between the ceramic chuck and metal flange. A specified flatness is demanded for the adsorption face of the chuck for adsorbing the wafer during semiconductor processing. The chuck having the deteriorated flatness may thus be an off-specification product and reduces the production yield of the ceramic chuck.

SUMMARY OF THE INVENTION

An object of the invention is to provide a novel joined article having a ceramic supporting member for a semiconductor wafer, a metal member and a joining layer joining the supporting and metal members, and to improve the reliability of the air-tightness along the joining interface between the supporting and metal members. Another object of the invention is to prevent the deterioration of the flatness of the supporting face of the supporting member after the joining process.

The present invention provides a method for producing a joined body comprising a supporting member made of a ceramic material for supporting a semiconductor wafer, a metal member and a joining layer for joining the supporting and metal members. The method comprises the steps of:

forming a first metal film on a surface to be joined of the supporting member;

forming a second metal film on a surface to be joined of the metal member;

placing a metal adhesive between the first and second films to provide an assembly; and heating the assembly at a temperature not higher than a melting point of the metal adhesive while the assembly is subjected to isostatic pressing so that the supporting and metal members are joined by diffusion joining.

The invention further provides a joined article obtained by the above method.

The inventors tried the following process. An assembly was prepared having a semiconductor supporting ember with a first metal film, a metal member with a second metal film and a metal adhesive. The assembly was heated at a temperature not higher than a melting point of the metal adhesive, while the assembly was subjected to isostatic pressing. They have found that the metal adhesive may be diffusion joined with the first and second films to provide a joined article of the metal and supporting members, and have thus attained the present invention. According to the present invention, it is possible to secure the air-tightness of the joining interface with improved reliability and to prevent the deterioration of the flatness of the supporting face of the supporting member after the joining process.

These and other objects, features and advantages of the invention will be appreciated upon reading the following description of the invention when taken in conjunction with the attached drawings, with the understanding that some modifications, variations and changes of the same could be made by the skilled person in the art.

DETAILED DESCRIPTION OF THE INVENTION

Figure 1:
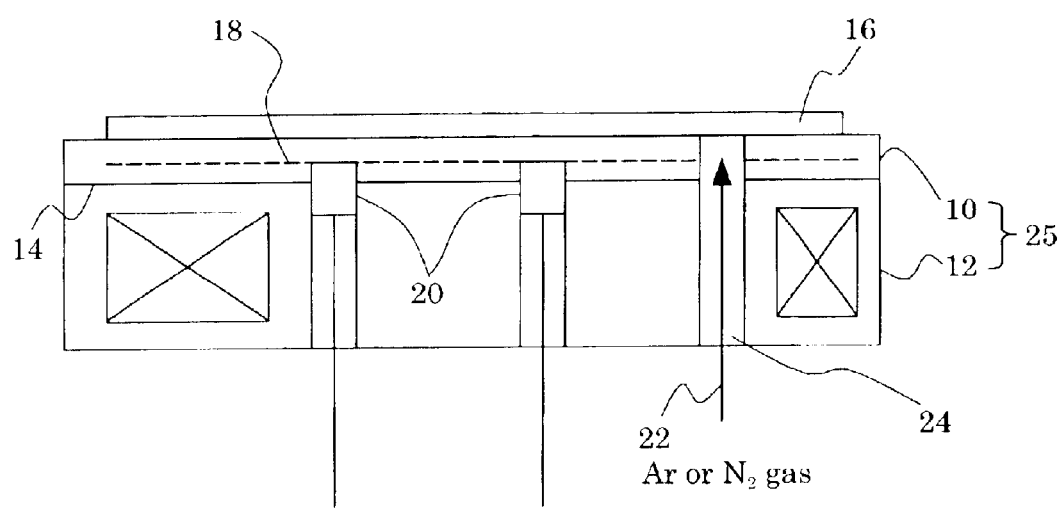
FIG. 1 is a drawing schematically showing a joined article 25 according to one embodiment of the invention.

The present invention will be described further, referring to the attached drawings. FIG. 1 is a drawing schematically showing a joined article according to one embodiment of the invention. The joined article 25 is composed of an electrostatic chuck 10, a cooling flange 12 and a joining layer 14. The chuck 10 has an electrode 18 for electrostatic chuck embedded therein. A terminal 20 is connected with the electrode 18. The electrostatic chuck 10 has an adsorption face for supporting and adsorbing a semiconductor wafer 16. In the example, a through hole 24 is provided through the cooling flange 12 and chuck 10. A back side gas, such as argon gas or nitrogen gas, may be supplied through the through hole 24 as an arrow 22. Further, other through holes (not shown) may also be provided in the cooling flange 12 and chuck 10 for inserting lift pins for lifting the semiconductor wafer 16 from the adsorption face.

Figure 2:
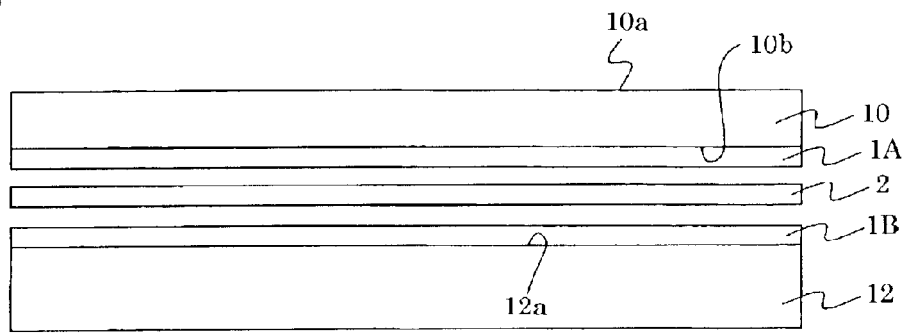
FIG. 2(a) is a drawing schematically showing a supporting member 10 for a semiconductor wafer, a metal member 12, and a sheet 2 of a metal adhesive interposed between the members 10 and 12.
FIG. 2(b) schematically shows an assembly 13 vacuum packaged with a packaging film 3.
Figure 2:
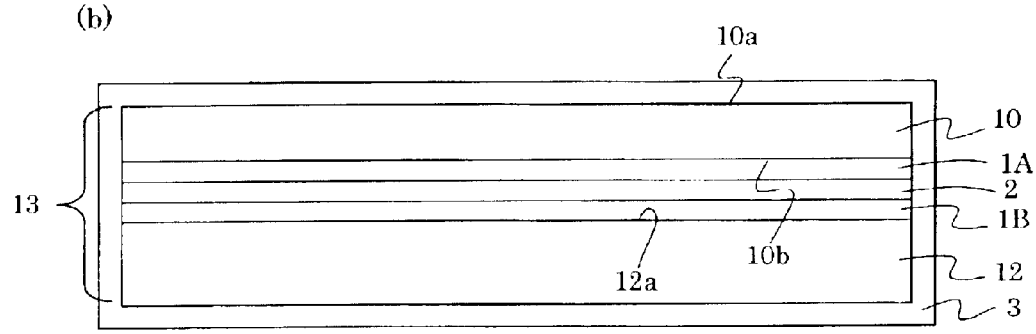
Figure 3:
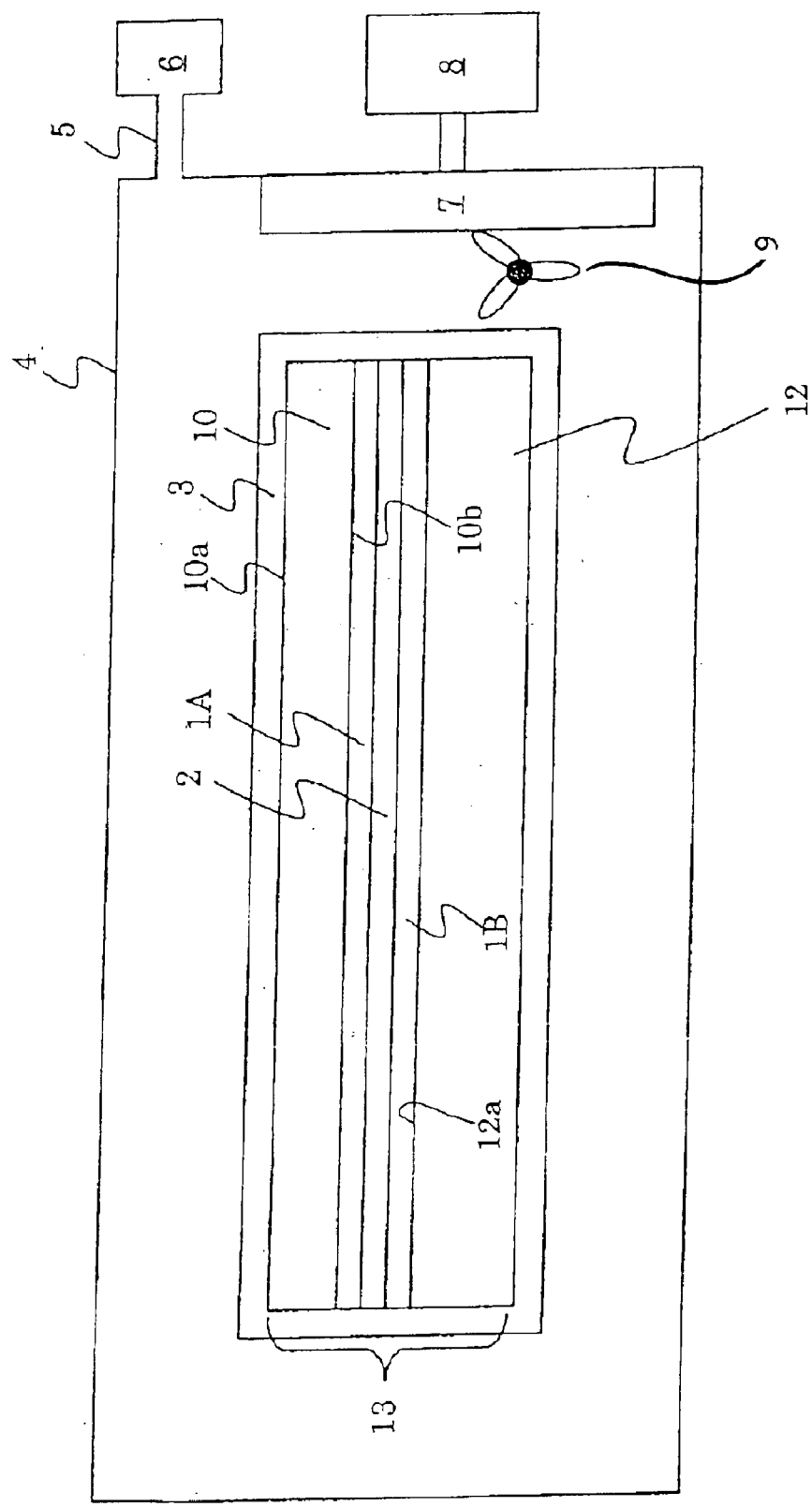
FIG. 3 is a diagram schematically showing the vacuum packaged assembly 13 contained in an autoclave 4.

A process for producing a joined article, such as that shown in FIG. 1, will be described referring to FIGS. 2 and 3. In FIGS. 2 and 3, the detailed structure of the electrostatic chuck or cooling flange shown in FIG. 1 are omitted for the purpose of providing a general explanation of the process according to the invention.

A supporting member 10 for supporting a semiconductor wafer may have any and various functions as long as it may work as a susceptor for setting a semiconductor wafer. For example, when an electrode for electrostatic chuck is provided inside of the substrate of the member, such member may be used as an electrostatic chuck system. Alternatively, when a resistance heating element is provided inside of the substrate, the supporting member may be used as a ceramic heater. Further, when an electrode for generating plasma is provided inside of the substrate, the supporting member may be used as an electrode device for generating plasma. In a particularly preferred embodiment, the supporting member is an electrostatic chuck.

The substrate of the supporting member 10 may be a ceramic material including an oxide ceramics such as alumina, calcium titanate, barium titanate and a nitride ceramics. Silicon nitride and sialon is preferred among nitride ceramics for further improving the resistance of the supporting member against thermal stress. Aluminum nitride is preferred for improving the anti-corrosion property against a fluorine-based corrosive gas and thermal conductivity of the supporting member.

The kind of the metal member 12 is not particularly limited. In a preferred embodiment, the metal member comprises a cooling mechanism. The material for the metal member is not particularly limited, and may preferably be aluminum, copper, stainless steel, nickel or the alloys thereof when the metal member is to be exposed against a halogen based corrosive gas.

A refrigerant used for the cooling mechanism may be a liquid, such as water and silicone oil, and a gas such as air and an inert gas.

As shown in FIG. 2(a), a first metal film 1A is provided on the joining face 10b of the supporting member 10, and a second metal film 1B is provided on the joining face 12a of the metal member 12. These metal films may be made of a process not particularly limited, including ion plating, chemical vapor deposition, physical vapor deposition, organic metal chemical vapor deposition, vapor deposition, sputtering and plating processes.

The thickness of the metal film 1A or 1B may preferably be not smaller than 0.5 $\mu$m and more preferably be not smaller than 1.0 $\mu$m for further improving the air-tightness of the joining layer. The thickness of the metal film 1A or 1B may preferably be not larger than 3.0 $\mu$m for improving the productivity.

The material for the metal films 1A, 1B is not particularly limited, as long as it may be diffused into the metal adhesive and the adhesive may be diffused into the film. The material, however, may preferably contain at least one metal element selected from the group consisting of indium, gold, nickel, copper and titanium for preventing the contamination of a semiconductor wafer. In other words, the material may be a pure metal substantially consisting of the selected metal element, or the material may be an alloy of the selected metal element. These pure metals and alloys may contain metal impurities. When the material is an alloy, such alloy may preferably be composed of two or more metal elements selected from the group consisting of indium, gold, nickel, copper and titanium, substantially free from another metal element.

Then, as shown in FIG. 2(a), a sheet 2 made of a metal adhesive is set between the joining faces 10b and 12a. The metal adhesive 2 is not particularly limited, as long as it may be diffused into the metal film 1A, 1B and the film material may be diffused into the adhesive. Indium, gold and copper are particularly preferred.

The metal adhesive 2 may preferably be pure indium metal or the alloy of indium. The pure indium metal may contain inevitable impurities. The alloy of indium may contain gold, silver or tin. The amount of the metal or metals other than indium in the alloy may preferably be not larger than 10 weight percent.

The thickness of the sheet 2 made of a metal adhesive is not particularly limited. The thickness of the sheet 2 may preferably be not smaller than 10 $\mu$m for further improving the air-tightness in the joining interface. The thickness of the sheet 2 may preferably be not larger than 1 mm for reducing the difficulty of controlling the tolerance of the thickness.

The thus obtained assembly 13 is heated while it is subjected to isostatic pressing. The actual methods applied for performing the heating and isostatic pressing are not particularly limited. Preferably, as shown in FIG. 2(b), the assembly 13 is vacuum packaged in a packaging film 3 and then contained in a sealed container filled with an inert gas. The vacuum packaged assembly is subjected to isostatic pressing with the inert gas in the sealed container. Alternatively, the assembly may be subjected to isostatic pressing with a liquid.

The material of the film 3 is not particularly limited, as long as it has elasticity and thermal resistance at a temperature applied for heating the assembly. The inert gas may be nitrogen, argon or a mixed gas of nitrogen and argon. The pressure of the inert gas in the sealed container is not limited as long as it is effective for producing a joined article having a sufficiently high air tightness. The pressure of the gas may preferably be not lower than 5 atm for further improving the air-tightness of the joined article. The upper limit of the gas pressure is not particularly set on the viewpoint of the invention. The pressure may preferably be not higher than 100 atm and more preferably not higher than 20 atm from the practical point of view.

The maximum temperature during the heating of the assembly is not particularly limited, as long as mutual diffusion takes place between the metal films 1A, 1B and metal adhesive 2. The preferred temperature for the diffusion process correlates with the melting point of the metal adhesive. In a preferred embodiment, the maximum temperature is lower than "T" ° C. and not lower than (T+273× 0.9) K, provided that the melting point of the metal adhesive 2 is "T"° C.

When the metal adhesive 2 is pure indium, the maximum temperature during the heating may preferably be 113 to 155° C. and more preferably be 140 to 155° C.

The sealed container is not particularly limited and preferably an autoclave.

In a preferred embodiment, as shown in FIG. 3, a vacuum packaged assembly 13 is contained in an autoclave 4, and then heated and pressed. A gas source 6 is connected through a gas passage 5 in the autoclave 4. A heater 7 is also contained in the autoclave 4 and the calorific power of the heater is controlled with a power controller 8. A fan 9 is provided in the front of the heater 7 for reducing the temperature deviation in the autoclave.

Figure 4:
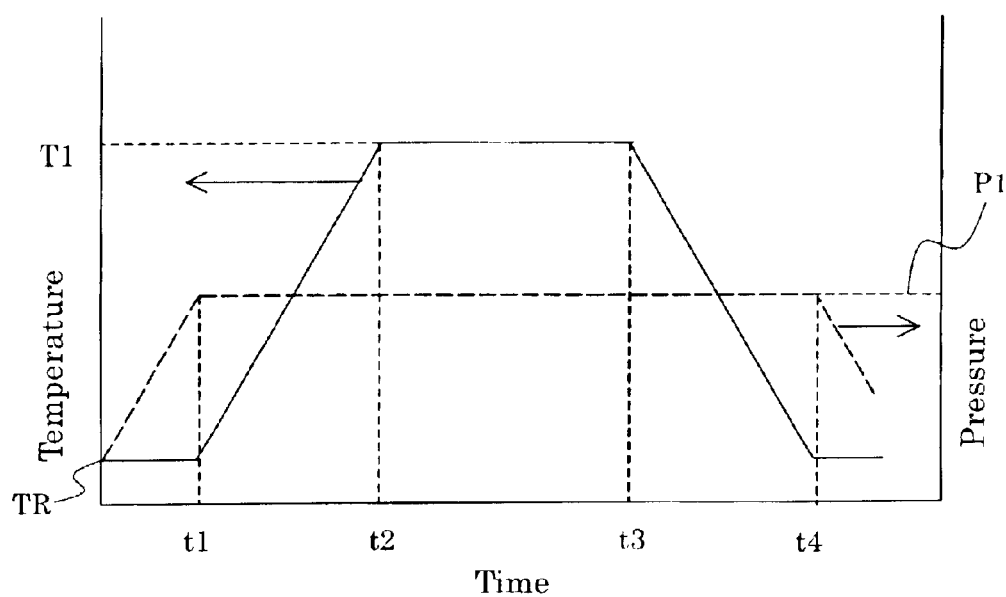
FIG. 4 is a graph schematically showing an example of a schedule of temperature and pressure during the joining process of the invention.

According to the method of the invention, it is necessary to carry out isostatic pressing when heating the assembly at the above maximum temperature. That is, as shown in FIG. 4, it is needed that the pressure reaches a specified value "P1" during the maximum temperature "T1" (from the time points "t2" to "t3".)

In a preferred embodiment, the isostatic pressing is continued during the temperature reduction period after "t3" (the end of maximum temperature period). In a particularly preferred embodiment, the isostatic pressing is continued to "t4" (the end of the temperature reduction period to room temperature T4). It is found that the continued isostatic pressing may be effective for further improving the flatness of the supporting face of the supporting member after the joining process.

In the joined article of the present invention, the flatness of the supporting face of the supporting member may preferably be not larger than 30 μm and more preferably be not larger than 10 μm.

EXAMPLES

Experiment "A"

A joined article shown in FIG. 1 was produced. Concretely, an electrostatic chuck 10 and water cooling flange 12 were prepared, as shown in FIG. 2(a). The substrate for the electrostatic chuck 10 has a shape of a disk with a diameter φ of 300 mm and a thickness of 10 mm and made of aluminum nitride. An electrode composed of a molybdenum mesh was embedded within the substrate. The water cooling flange 12 is made of the alloy of aluminum and had a shape of a disk with a diameter φ of 300 mm and a thickness of 30 mm. A water cooling groove, holes for terminals, through holes for inserting lift pins and a through hole for supplying a back side gas were provided inside of the water cooling flange 12. The adsorption face 10a of the chuck 10 had a flatness of 10 μm. Each of the joining faces 10b and 12a had a flatness of not larger than 30 μm.

A film made of indium and having a thickness of 3 μm was formed on each of the joining faces 10b and 12a by means of ion plating. An indium foil was inserted between the joining faces 10b and 12a. The indium foil was made of pure indium having a purity of 99.9 percent, and had a shape of a disk with a diameter φ of 300 mm and a thickness of 0.2 mm. The tolerance of the thickness of the foil was ±10 percent. The assembly 13 was then vacuum packaged and contained in an autoclave 4 whose inner space had been evacuated.

The assembly was then subjected to heating and isostatic pressing according to the schedule shown in FIG. 4. That is, the inner pressure was elevated to 14 atm "t1", and the temperature was then elevated from room temperature to 154° C. A temperature of 154° C. and pressure of 14 atm were then maintained for 5 hours. The temperature was then reduced to room temperature while the pressure was maintained at 14 atm. The pressure was finally reduced to 1 atm and the resultant joined article was removed from the autoclave.

A system for detecting the leakage of helium gas was used to carry out helium leakage test for each of the holes for terminals, through holes for lift pins and through hole for back side gas. As a result, the leakage amount of helium gas was on the order of $1 \times 10^{-10}$ Pa·m$^3$/s for each of the tested holes.

Further, the flatness of the adsorption face of the electrostatic chuck was measured. The method for the measurement will be desired. An electrostatic chuck 10 or joined article was set on a surface plate with the adsorption face upside. The height of each measuring point of the adsorption face was measured using a height gauge. In the present measurement, the central point of the adsorption face was selected as one of the measuring points. Further, 8 points were selected along an X-axis and 8 points were selected along a Y-axis on the adsorption face, with both axes passing through the central point. The heights were measured for each of the selected 17 measuring points. The difference of the maximum and minimum values of the measured heights was calculated to provide the flatness.

As a result, the flatness of the adsorption face of the electrostatic chuck after the joining process was 10 μm, which was not different from that before the joining process.

Experiment "B"

Each sample was produced according to the substantially same process described in the experiment "A" section and then subjected to the measurement of the flatness of the supporting face and leakage amount of helium gas. A rectangular plate 10 made of aluminum nitride produced by hot pressing without an embedded electrode was used instead of the electrostatic chuck in the experiment "A." The plate 10 has a length of 50 mm, width of 50 mm and thickness of 5 mm. A through hole with a diameter φ of 5 mm was formed in the central part of the plate 10. The supporting face 10a of the plate 10 had a flatness of 10 μm.

A rectangular plate made of an aluminum alloy A6061 was prepared instead of the water cooling flange 12 described in the experiment "A." The plate 12 has a length of 50 mm, width of 50 mm and thickness of 5 mm. A through hole with a diameter φ of 5 mm was formed in the central part of the plate. Each of the joining faces 10b and 12a had a flatness of not larger than 30 μm.

The indium foil used was made of pure indium having a purity of 99.9 percent and had a length of 50 mm, width of 50 mm and thickness of 0.2 mm, with the tolerance of thickness of ±10 percent.

The metal films 1A and 1B were formed by ion plating. The material and thickness of each of the metal films 1A and 1B were changed as shown in table 1. The maximum temperature "T1" and pressure "P1" during the joining process were changed as shown in Table 1. The flatness of the supporting face 10a and leakage amount of helium gas were measured for each of the obtained samples. The results were shown in Table 1. In table 1, the leakage amount of helium gas was described using abbreviation. For example, "2.50 E-10" means "$2.50 \times 10^{-10}$."

TABLE 1

| | Material of Underlying Metal film | Thickness Of metal film (μm) | Joining Temperature (° C.) | Pressure of Nitrogen gas (atm) | Leakage amount of Helium gas (Pa · m³/s) | Flatness of Supporting face (μm) |
|---|---|---|---|---|---|---|
| 1 | In | 3 | 154 | 14 | 2.50E-10 | 12 |
| 2 | In | 1 | 154 | 14 | 3.50E-10 | 15 |
| 3 | Au | 3 | 154 | 14 | 5.50E-10 | 15 |
| 4 | Ni | 3 | 154 | 14 | 5.70E-10 | 13 |
| 5 | Cu | 3 | 154 | 14 | 4.00E-09 | 15 |
| 6 | Ti | 3 | 154 | 14 | 6.50E-09 | 14 |
| 7 | None | None | 154 | 14 | Larger than 1E-6 Unmeasurable | 12 |
| 8 | In | 3 | 100 | 14 | Larger than 1E-6 Unmeasurable | 12 |
| 9 | In | 0.3 | 154 | 14 | 8.5E-09 | 15 |
| 10 | In | 3 | 154 | 3 | 7.0E-09 | 15 |

In the samples 1 to 6 according to the present invention, the leakage amounts of helium gas were small. In particular, it was preferred to apply gold, nickel or indium, and most preferred to apply indium, as the material of the metal film. In the sample number 7 a comparative example, the metal films were not formed and thus the leakage amount of helium gas was large. In the sample number 8 as comparative example, the maximum temperature during the heating process was as low as 100° C., so that mutual diffusion was not induced between the metal film and metal adhesive, resulting in the failure of joining process. In the sample number 9 within the present invention, the joining layer was formed. However, the underlying metal film had a smaller thickness of 0.3 μm, resulting in slightly reduced air-tightness. In the sample number 10 within the present invention, the pressure of nitrogen gas was lower (3 atm), resulting in slightly reduced air-tightness.

As described above, the invention provides a novel joined article having a ceramic supporting member for a semiconductor, a metal member and a joining layer joining the supporting and metal members. According to the article, the reliability of the air-tightness along the joining interface between the supporting and metal members may be improved, and the deterioration of the flatness of the supporting face of the supporting member may be prevented.

The present invention has been explained referring to the preferred embodiments, however, the present invention is not limited to the illustrated embodiments which are given by way of examples only, and may be carried out in various modes without departing from the scope of the invention.

What is claimed is:

1. A method of producing a joined body comprising a supporting member made of a ceramic material for supporting a semiconductor wafer, a metal member and a joining layer for joining said supporting member and said metal member, said method comprising the steps of:

forming a first metal film on a joining surface of said supporting member;

forming a second metal film on a joining surface of said metal member;

placing a metal adhesive between said first metal film and said second metal film to provide an assembly; and heating said assembly at a temperature not higher than a melting point of said metal adhesive while said assembly is subjected to isostatic pressing so that said supporting member and said metal member are joined by diffusion bonding.

2. A method of producing a joined bode comprising a supporting member made of a ceramic material for supporting a semiconductor wafer, a metal member and a joining layer for joining said supporting member and said metal member, said method comprising the steps of:

forming a first metal film on a joining surface of said supporting member;

forming a second metal film on a joining surface of said metal member;

placing a metal adhesive between said first metal film and said second metal film to provide an assembly;

vacuum packaging said assembly using a packaging film to provide a packaged assembly;

placing said packaged assembly in a sealed container filled with an inert gas, so that said assembly is pressed by said inert gas through said packaging film in said container; and heating said assembly at a temperature not higher than a melting point of said metal adhesive while said assembly is subjected to isostatic pressing so that said supporting member and said metal member are joined by diffusion bonding.

3. A method of producing a joined body comprising a supporting member made of a ceramic material for supporting a semiconductor wafer, a metal member and a joining layer for joining said supporting member and said metal member, said method comprising the steps of:

forming a first metal film on a joining surface of said supporting member;

forming a second metal film on a joining surface of said metal member;

placing a metal adhesive between said first metal film and said second metal film to provide an assembly; and heating said assembly at a temperature not higher than a melting point of said metal adhesive while said assembly is subjected to isostatic pressing so that said supporting member and said metal member are joined by diffusion bonding;

wherein said metal adhesive comprises a metal containing at least indium.

4. The method of claim 3, wherein said metal adhesive comprises pure indium.

5. The method of claim 3, wherein said metal adhesive comprises an alloy of indium.

6. The method of claim 5, wherein said alloy contains one or more metals selected from the group consisting of gold, silver and tin.

7. The method of claim 1, wherein at least one of said first and said second metal films contains a metal selected from the group consisting of indium, gold, nickel, copper and titanium.

8. The method of claim 1, wherein at least one of said first and said second metal films is formed by ion plating.

9. The method of claim 1, wherein said ceramic material for said supporting member comprises an oxide ceramic or a nitride ceramic.

10. The method of claim 9, wherein said ceramic material is selected from the group consisting of silicon nitride, sialon and aluminum nitride.

11. The method of claim 1, wherein said assembly is heated to a temperature lower than "T" ° C. and not lower than (T+273×0.9) K, wherein "T" ° C. is said melting point of said metal adhesive.

12. A method of producing a joined body comprising a supporting member made of a ceramic material for supporting a semiconductor wafer, a metal member and a joining layer for joining said supporting member and said metal member, said method comprising the steps of:

forming a first metal film on a joining surface of said supporting member;

forming a second metal film on a joining surface of said metal member;

placing a metal adhesive between said first metal film and said second metal film to provide an assembly; and heating said assembly at a temperature not higher than a melting point of said metal adhesive while said assembly is subjected to isostatic pressing so that said supporting member and said metal member are joined by diffusion bonding;

wherein said assembly is heated to a temperature in a range of 113 to 155° C.

13. The method of claim 1, further comprising a step of cooling said assembly to room temperature after said heating step while subjecting said assembly to isostatic pressing.

14. A method of producing a joined body comprising a supporting member made of a ceramic material for supporting a semiconductor wafer, a metal member and a joining layer for joining said supporting member and said metal member, said method comprising the steps of:

forming a first metal film on a joining surface of said supporting member;

forming a second metal film on a joining surface of said metal member;

placing a metal adhesive between said first metal film and said second metal film to provide an assembly; and heating said assembly at a temperature not higher than a melting point of said metal adhesive while said assembly is subjected to isostatic pressing so that said supporting member and said metal member are joined by diffusion bonding;

wherein said supporting member comprises an electrostatic chuck and said metal member comprises a cooling flange.

15. A joined article obtained by the method of claim 1.

16. The article of claim 15, wherein said article is exposed to a halogen-based corrosive gas.

* * * * *